United States Patent
Hamamura et al.

(10) Patent No.: US 6,303,932 B1
(45) Date of Patent: Oct. 16, 2001

(54) METHOD AND ITS APPARATUS FOR DETECTING A SECONDARY ELECTRON BEAM IMAGE AND A METHOD AND ITS APPARATUS FOR PROCESSING BY USING FOCUSED CHARGED PARTICLE BEAM

(75) Inventors: Yuichi Hamamura, Yokohama; Akira Shimase, Yokosuka; Junzou Azuma, Ebina; Michinobu Mizumura; Norimasa Nishimura, both of Yokohama; Yasuhiro Koizumi, Sayama; Hidemi Koike, Hitachinaka, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/195,711

(22) Filed: Nov. 19, 1998

(30) Foreign Application Priority Data

Nov. 20, 1997 (JP) .............................................. P09-319288

(51) Int. Cl.[7] .................................................. H01J 37/244
(52) U.S. Cl. ...................... 250/309; 250/492.21; 250/397
(58) Field of Search ................................... 250/309, 310, 250/192.21, 397

(56) References Cited

U.S. PATENT DOCUMENTS

| | | | |
|---|---|---|---|
| 4,645,929 | * | 2/1987 | Criegern et al. ...................... 250/309 |
| 5,008,537 | * | 4/1991 | Toita et al. ............................. 250/309 |
| 5,023,453 | * | 6/1991 | Adachi et al. ......................... 250/309 |
| 5,035,787 | * | 7/1991 | Parker et al. ....................... 250/492.21 |
| 5,357,116 | * | 10/1994 | Talbot et al. ..................... 250/492.21 |

* cited by examiner

Primary Examiner—Bruce C. Anderson
(74) Attorney, Agent, or Firm—Antonelli, Terry, Stout & Kraus, LLP

(57) ABSTRACT

A secondary charged particle image acquisition method and its apparatus for detecting a secondary charged particle image. The method includes the steps of irradiating a surface of a specimen with a focused charged particle beam and detecting a secondary charged particle emanated from the surface of the specimen, obtaining a secondary charged particle image based on the detected secondary charged particle, irradiating a positive ion beam on the surface of the specimen where the focused charged particle beam is irradiated and inducing a conductive layer on the surface of the specimen by the irradiation of the positive ion beam and diffusing an electric charge on the surface of the conductive layer.

19 Claims, 4 Drawing Sheets

METHOD AND ITS APPARATUS FOR DETECTING A SECONDARY ELECTRON BEAM IMAGE AND A METHOD AND ITS APPARATUS FOR PROCESSING BY USING FOCUSED CHARGED PARTICLE BEAM

BACKGROUND OF THE INVENTION

This invention relates to a method and its apparatus for detecting a secondary electron emitted from a specimen, such as an LSI or photomask, irradiated by a focused charged particle beam to inspect a minute portion of it or to process it by etching or deposition.

In using focused ion beam apparatus, imbalance between income of charged energy beam and outgo of secondary charged particles on a surface of an insulating layer causes charge build-up This phenomena produces a problem of deterioration of the positioning accuracy of the charged energy beam on the surface and of electrostatic discharge.

In Japanese patent application laid open No. 3-138846 (prior art 1), a focused ion beam apparatus is described. The apparatus comprises an ion-beam irradiating means for irradiating focused ion-beam on a substrate, an electron beam source launching a low energy electron beam, a neutralizing means for neutralizing the surface charge caused by the incident ion beam by irradiating the electron beam around the irradiate portion on the surface of the substrate, and an controlling means which controls the electron beam for the neutralization on the basis of detected secondary charged particles emanated from the substrate.

And, in Japanese patent application laid open No. 60-200449 (prior art 2), it is described that a charge build-up of a specimen to be processed by irradiating an ion beam to dope into it is prevented without influencing the vicinity by irradiating an negative ion beam to neutralize in accordance with the amount of secondary electron emanated from the specimen or the amount of doped ion. And in case of irradiation of a focused ion beam, it is need to detect and observe the surface of a specimen by detecting a secondary electron emanated from it.

In Japanese patent application laid open No. 01-30155 (prior art 3), a method for preventing an electrostatic discharge of a sample by implanted ion in an ion implanting process is described. It says that in implanting ion into a sample, which is a mask a pattern of an insulation material on a silicon (Si) substrate, the sample is irradiated with another charged beam such as an electron beam, a positive ion beam. By irradiating like this, an electrical resistance of the insulating material on the silicon substrate is decreased and the implanted ion is discharged by flowing through a thickness direction of the insulating material.

A method of forming a pattern on a resist film by irradiating a charged particle beam on it is described in a Japanese patent application laid open No. 63-272034 (prior art 4). And a technic for preventing charge build-up of the resist film by irradiation of a charged particle beam is achieved by changing the electrical resistivity of it with a irradiation of low energy ion.

In general, as is described in the prior art 1, in a focused ion beam processing system, image of a sample is obtained by extracting secondary electron emitted from the surface of the specimen with a irradiation of a focused ion beam.

Also in the prior art 1, secondary charged particles produced by the irradiation of a focused ion beam are detected and the neutralizing electron beam is controlled based on the detection.

In this method to control the neutralizing electron beam, the relation between the amount of the irradiated ion beam and of the emanated secondary charged particle is determined experimentally. And, in practice, it is very difficult to control the electron beam for neutralization because the above relationship is easily influenced by the difference of the material and by the cleanliness of the surface of the specimen.

And in general, to detect a secondary ion, a front electrode of a charged particle detector is supplied a negative voltage. On the other hand, to detect a secondary electron, a front electrode of a charged particle detector is supplied a positive voltage.

In the prior art 1, when detecting the secondary ion, the electron beam for neutralization is irradiated during the detection. And when detecting the secondary electron, the electron beam for neutralization is irradiated mutually with a focused ion beam to prevent the neutralizing electron beam extracted to a charged particle detector during the detection.

Also in the prior art 2, when detecting the secondary ion, the electron beam for neutralization is irradiated during the detection. And when detecting the secondary electron, irradiation of the electron beam for neutralization is stopped during the detection.

As is discussed above, neutralizing technique by irradiating an electron beam or negative ion beam to a specimen to prevent charge build-up on the surface caused by the irradiation of a focused ion beam is described in the prior art 1 and 2. But, from our experiment, it involves a problem that it is very hard to detect a secondary electron during the irradiation of the ion beam and a very complex control is need.

In the prior art 3 and 4, a technique for preventing a charge build-up of a insulating film by reducing a resistivity of the film is described. But they are silent about detecting secondary electron to obtain a high resolution image to inspect and process the surface of the specimen by a focused charged particle beam.

SUMMARY OF THE INVENTION

This invention provides a system and its method for detecting a secondary electron and/or secondary ion emanated from a specimen by the irradiation of a focused charged particle beam (such as ion beam or electron beam) and obtaining a high resolution image of the specimen on real time. And the system and its method enables avoiding a charge build-up and detecting the secondary electron beam continuously and stably during the irradiation of the ion beam to the specimen irrespective of the surface condition or quality of the material of the specimen.

This invention also provides a system and its method for etching or film forming or exposing in the order of less than 1.0 μm by using a focused charged particle beam. And also this invented system and its method enables avoiding a charge build-up and detecting the secondary electron beam continuously and stably during the irradiation of the charged particle beam irrespective of the condition and material of the specimen.

This invention relates to a secondary charged particle image acquisition method for detecting a secondary charged particle image, comprising the steps of irradiating a surface of a specimen with a focused charged particle beam and detecting a secondary charged particle emanated from the surface of the specimen, obtaining a secondary charged particle image based on the detected secondary charged particle, irradiating a positive ion beam on the surface of said specimen where said focused charged particle beam is irradiated, and inducing a conductive layer on the surface of said specimen by the irradiation of said positive ion beam and diffusing an electric charge on the surface of said conductive layer.

And said induced conductive layer is so induced that an electric charge diffusion means is electrically connected to said induced conductive layer.

And said focused charged particle beam irradiated to a specimen is a focused ion beam.

And said focused charged particle beam irradiated to a specimen is a focused electron beam.

And said secondary charged particle is a secondary electron and said detected secondary charged particle image is a secondary electron image.

And said secondary charged particle is a secondary ion and said detected secondary charged particle image is a secondary ion image.

And said method is further comprising the steps of stoping the irradiation of said positive ion beam, irradiating the surface of said sample with said focused charged particle beam wherein an electric charge of said surface is discharged through said induced conductive layer, detecting a secondary particle which is emanated from the surface of said specimen irradiated by said charged particle beam and obtaining a secondary charged particle image of said sample, and controlling a location of the forcused charged particle beam on the surface of said specimen based on said acquired secondary charged particle image and processing the specimen with said irradiated charged particle beam.

And said secondary charged particle is secondary electron and secondary ion which is detected alternatively and secondary charged particle image is acquired by the detection.

This invention relates to a focused charged particle beam apparatus comprising a charged particle beam irradiation means which irradiates a charged particle beam to a surface of a sample which is at least partially covered with an insulation film, an image acquisition means which detects a secondary charged particle emanated from the surface of the specimen irradiated by said charged particle beam loanched from said charged particle beam irradiation means and acquirs an secondary charged particle image of said surface, and a positive ion beam irradiation means which irradiates a positive ion beam to the surface of said sample including an area to which said focused charged particle beam is irradiated.

And said focused charged particle beam apparatus further comprising of a diffusion means which diffuses an electric charge to the earth, said electric charge is caused by said irradiation of said charged particle beam and said electric charge flows through an induced conductive layer formed on the surface of said specimen by said irradiation of said positive ion beam.

And said diffusion means electrically connects the earth and said induced conductive layer formed on the surface of said specimen.

And said focused charged particle beam irradiating means irradiates a forcused ion beam on the surface of a specimen.

And said focused charged particle beam irradiating means irradiates an electron beam on the surface of the specimen.

And said focused charged particle beam irradiating means irradiates an ion beam on the surface of the specimen.

And said image acquisition means detects a secondary electron emanated from the surface of the specimen irradiated by said charged particle beam launched from said charged particle beam irradiation means and acquires a secondary electron image of said surface.

And said image acquisition means detects a secondary ion emanated from the surface of the specimen irradiated by said charged particle beam launched from said charged particle beam irradiation means and acquires a secondary ion image of said surface.

And said image acquisition means includes a secondary electron detector and a secondary ion detector and a changeover switch which selects one of the output from said secondary electron detector and said secondary ion detector and acquires a secondary electron image or secondary ion image of said surface.

This invention also relates to a focused charged particle beam apparatus comprising a focused charged particle beam irradiation means which irradiates a surface of a specimen with a focused charged particle beam, an image acquisition means which detects a secondary charged particle emanated from the surface of said specimen by the irradiation of said focused charged particle beam launched from said charged particle beam irradiation means and acquires a secondary charged particle image of the surface of said specimen and a charged particle beam irradiation means which irradiates a charged particle beam to the specimen to produce an induced conductive layer in an insulating portion on the surface of the specimen where said focused charged particle beam is irradiated.

And said focused charged particle beam irradiation means irradiates the surface of said sample with one of an ion beam or an electron beam.

And said image acquisition means detects a secondary electron or secondary ion emanated from the surface of said specimen by the irradiation of said focused charged particle beam loanched from said charged particle beam irradiation means and acquires a secondary electron image or a secondary ion image of the surface of said specimen.

DESCRIPTION OF THE PREFERRED EMBODIMENT

In the first through the third embodiment of this invention relates to a focused ion beam system for etching a semiconductor device for the inspection of the close sectional view or for modifying a semiconductor device by cutting or wiring a pattern or for repairing defects of an optically transparent mask pattern by etching and/or CVD.

The focused ion beam system according to this invention irradiates a focused ion beam to a specimen and detecting secondary ion or electron emanated from the specimen for the inspection or analyzing the surface of the specimen. In general, by the irradiation of a focused ion beam, secondary electron is emanated form the surface of the specimen more than that of secondary ion. And high S/N signal is obtained by detecting a secondary electron beam. Accordingly, secondary electron image is suit for inspection with a high resolution or accurate location of a focused ion beam to a processing area on the specimen.

In using a focused ion beam system, charge built-up on a dielectric surface of a specimen causes an inaccurate location of the focused ion beam or electrostatic discharge of the dielectric surface layer.

This invention provides a focused ion beam system with a high resolution secondary electron image of a specimen by accurately locating a focused ion beam on the surface of it for inspection or processing. It also enables real time inspection of a secondary electron image by avoiding a electrostatic discharge of the specimen with a conventional way.

Figure 1:
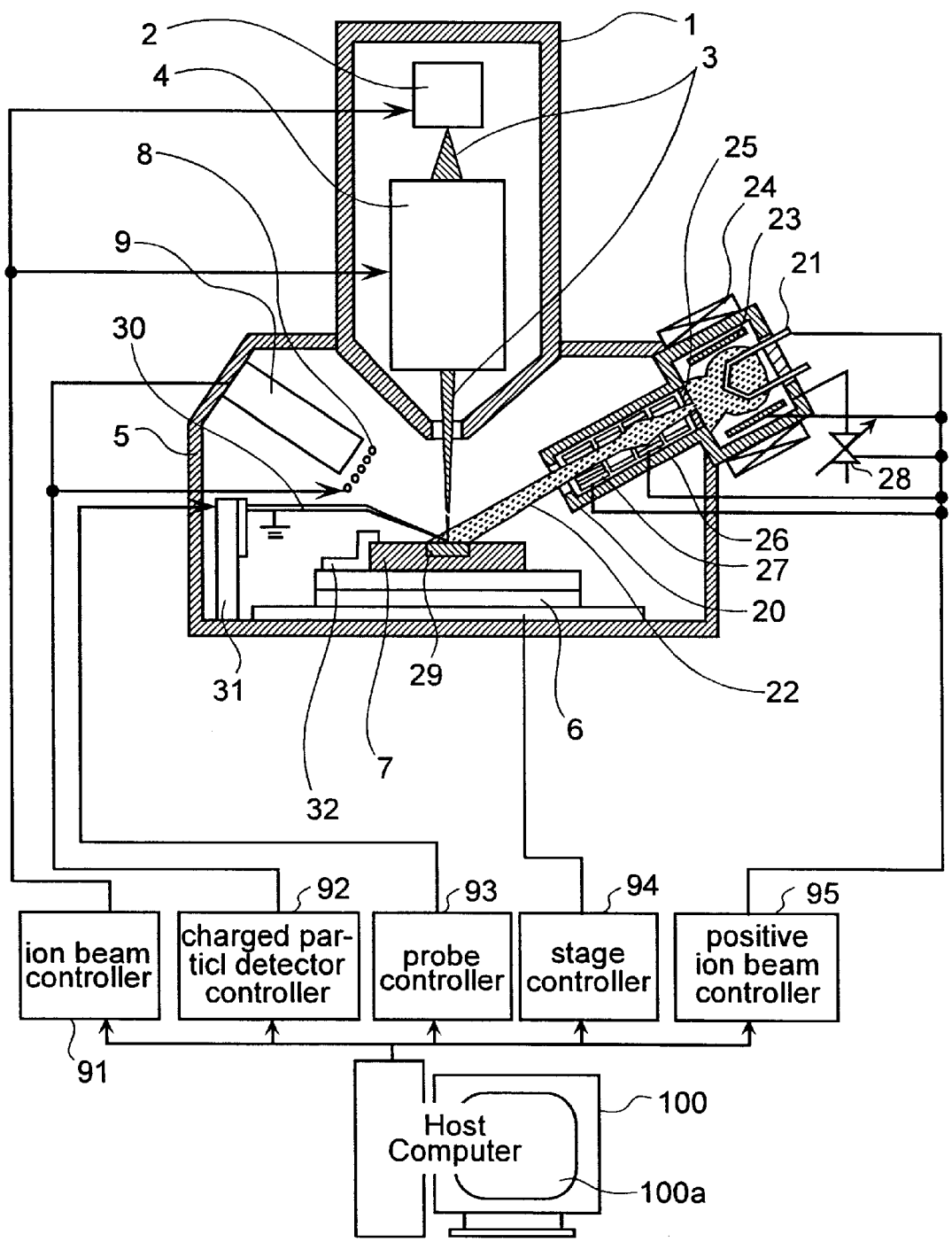
FIG. 1 illustrates a rough front image of the focused ion beam processing system according to the first embodiment of this invention.

FIG. 1 illustrates an outline structure of a focused ion beam processing apparatus.

This is a focused ion beam processing apparatus which concerns with the first preferred embodiment of this invention.

In the FIG. 1, 1 is an ion beam column in which an ion source 2 and ion optics 4 are installed and exhausted to vacuum by a vacuum system (not illustrated in the figure).

Ion source 2 is composed of a GA, liquid metal, ion source, Duoplasma ion source, or a gas plasma ion source.

Ion optics 4 accelerates and focuses an ion beam 3 extracted from ion source 2, and deflection control, irradiation and nonirradiate control (blanking) of the beam.

The ion optics system 4 is so composed, that (an acceleration voltage is supplied) to.

Further more, the ion optics 4 is also provided an electrostatic lens for focusing the ion beam 3, a deflection electrode for deflecting the ion beam 3 and a blanking electrode which conducts the state of irradiation (on or off) of the ion beam 3 to a specimen.

Ion beam 3 is extracted from an ion source 2 provided inside the ion beam column 1 which is evacuated to a high vacuum by the vacuum system (not illustrated in the drawings).

The ion beam 3 extracted from the ion source 2 is accelerated and focused by ion optics 4.

The ion optics 4 also controls the deflection of the ion beam 3 through the deflection electrode and the state of irradiation (on or off) to a specimen through the blanking electrode.

The extracted ion beam 3 is controlled (deflection control) to change its orbit to curve and then, another control to start or stops the irradiation (blanking) is conducted. Ion beam 3 is usually accelerated between 20 KV and 50 KV. And the ion beam current is set in a range from several pico A to several 10s nano A.

But above case is an example of this invention, and the range of the acceleration voltage and the current of an ion beam is not restricted by this example.

In common case, the diameter of the focused ion beam 3 is between 5 nm and 1 µm. The diameter of the focused ion beam 3 can be narrowed or spread according to the way how to use it.

The ion optics 4, shown as one of the embodiment equips a extraction electrode, an acceleration electrode, aligning electrode, a blanking electrode, stigma deflection electrode, an electrostatic lens and a beam limiting aperture.

To adjust the ion beam that is irradiated to the sample by ion optics system 4, the host computer 100 controls ion source 2 and ion optics system 4 through ion beam controller 91.

Using the above described focused ion beam processing apparatus, the following process can be carried out. First, by the vacuum system (not illustrated) sample room 5 is exhausted to a high-vacuum, and the vacuum is maintained. A sample 7 is mounted on stage 6 in the sample room 5 maintained to a vacuum. (The sample 7 can be mounted on stage 6 through a sample holder, if necessary.)

By irradiating and scanning the ion beam 3 on the surface of sample 7 placed on this stage 6, an observation, etching or deposition in a gaseous atmosphere can be performed. And by supplying material gas for etching in the vicinity of the sample 7 during a etching process it is possible to process the sample by gas assisted etching.

Stage 6 is composed of 5 axis stage which has a XY stage, and tilting mechanism for each axis. And the stage 6 is controlled by host computer 100 through stage controller 94.

When sample 7 is irradiated by ion beam 3, secondary charged particle (secondary ion and secondary electron) is emitted from the sample 7. This emitted to which a predetermined voltage is applied, secondary charged particle is extracted by a extracting electrode 8. And the extracted charged particle is detected by charged particle detector 9. The detected signal of the secondary charged particle is amplified and a SIM (Scanning Ion Microscope) image is generated.

A pattern formed on the specimen 7 can be observed by this SIM image. And positioning the focused ion beam 3 on the patterned sample 7 can be carried out by observing the SIM image.

In this embodiment, a secondary charged particle detected by the charged particle detector 9 is a secondary electron. By irradiating an ion beam on a specimen, both of a secondary electron and a secondary ion are emanated from the surface of the sample.

In general, the amount of a secondary electron is more than that of a secondary ion. And in the detected signal by the irradiation of an ion beam, the S/N ratio of secondary electron is higher than that of secondary ion.

So, in this embodiment, the charged particle detector 9 detects a secondary electron emitted from the specimen by the irradiation of the focused ion beam 3 to achieve a precise observation of the pattern on the specimen 7 and a precision positioning the focused ion beam on it.

To detect a secondary electron by the charged particle detector 9, positive voltage of hundreds V to thousands V is applied to the extracting electrode 8. And a secondary electron is extracted to the charged particle detector 9 efficiently.

The charged particle detector 9 is composed of a micro channel plate or-a combination of a scintillator and photomultiplier. The host computer 100 controls the voltage which is applied to the extracting electrode 8 and charged particle detector 9 through the charged particle detection controller 92. The detected signal produced by the detection of the secondary electron by the charged particle detector 9 is taken in to host computer 100. The taken in signal is processed a image processing and is displayed on monitor screen 100A.

When the applied voltage to the extracting electrode 8 is different between the processes of etching the specimen or forming a thin film on the specimen and observing a pattern formed on the specimen or positioning the ion beam on the specimen, the electric field where the ion beam is passing through is influenced by the applied voltage and changes by the difference of the applied voltage, the position where the specimen is processed by the ion beam is shift from the position to be processed.

To avoid this, the voltage applied to the extracting electrode is equalized between each process. If an insulating layer is located on a surface of the specimen 7, irradiation of an focused ion beam on the specimen 7 causes an accumulation of ion irradiated in the insulating layer or emanation of secondary electron from the insulating layer which result in an accumulation of an electric charge on the surface of sample 7.

With this, charge build-up happens on the surface of sample 7 and an electric field is formed in the vicinity to the surface. This electric field bends the orbit of ion beam 3 which incident in the surface of this sample 7. And the bending of ion beam orbit causes a deviation of a manufacture position by the ion beam on the specimen. And, if the charge build-up exceeds, an electrostatic discharge occurs at the specimen.

To prevent charge build-up at the insulating film on the surface of the specimen, a positively charged 7, ion beam (positive ion beam) 22 is irradiated at the surface of the specimen 7 surrounding the ion beam irradiating position by the positive ion beam supplying means 20 provided in the sample room 5.

The detail of the positive ion beam supply means 20 is below.

The material gas is supplied from a gas bomb (not illustrated) and through a flux variance valve or mass flux control means 28, into positive ion beam suppjy means 20. This positive ion beam supply means 20 has filament 21 for a thermoelectric emission and anode 23 for extracting a thermoelectron.

The thermoelectron emitted by the filament 21 and extracted by the anode 23 is restrained in the magnetron type magnetic field formed by the solenoid 24 (a permanent magnet can be substituted). Material gas introduced into positive ion beam supply means 20 comes into a plasma by the thermoelectron restrained in the magnetic field.

By applying a voltage which is negative against the plasma to the extracting electrode 250 of the positive ion beam supply means 20, positive ion beam 22 is obtained. This positive ion beam 22 is focused by lens 26 to converge at the deflector 27 and is irradiated at a desired position on the surface of the specimen. And, it is also possible to scan the positive ion beam 22 on the specimen 7 by deflector 27. And, the positive ion beam 22 (which is irradiated on the specimen) can be accelerated by increasing the potential of the plasma in the positive ion beam supply means 20.

The acceleration voltage is controlled by the following condition. That is, the acceleration voltage to accelerate the ion beam is set greater than a energy which is necessary for the surface of the insulating layer to be conductive (more than 10 eV). And the acceleration voltage is set smaller than a energy to sputter the surface of the specimen. Or the upper limit of the acceleration voltage of the positive ion is set smaller than a energy which will not cause a bad influence to the specimen by sputtering (which is the acceleration several 10s eV, and if the mass number of the positive ion beam 22 is relatively small, the acceleration voltage can be greater).

Increasing of the pressure inside the sample room 5 can be prevented by providing an orifice where the positive ion beam 22 is extracted from the plasma and the space where the plasma is produced is exhausted to vacuum by another system. And, extracting electrode 25 can also be an orifice.

The positive ion beam supply means 20 is controlled by host computer 100 (through positive ion beam controller 95).

By the irradiation of an ion beam to a specimen, both secondary electron and secondary ion are emanated from the specimen, and in the first embodiment, secondary electron is detected.

When irradiating an ion beam to a specimen, the quantity of a secondary electron emanated from the specimen is greater than that of a secondary ion. And the signal to noise ratio (S/N ratio) obtained from the detected signal of the secondary electron is higher than that of the secondary ion.

A secondary electron image of a pattern formed on the specimen 7 can be observed clearly by applying a positive voltage to the extracting electrode 8 to effectively collect the secondary electron to the detector 9. And, the positioning accuracy of the ion beam 3 on the pattern for processing can be improved.

The irradiation of the positive ion beam onto the insulating layer of the specimen will not cause an extraction of the positive ion beam to the charged particle detector 9 and will not obstruct the detection of the scanning ion microscope (SIM) image. Then, the mechanism of preventing a charge built-up of a sample will be explained in detail.

When an accelerated ion beam is irradiated on the surface of the insulating layer of the specimen, as described in the first embodiment, a thin surface insulating layer induced to conductive temporarily, and when the irradiation is stopped, the induced conductive layer disappears with some time constant. This phenomenon is not limited to a metal ion like gallium (GA).

The positive ion beam is irradiated at an area surrounding the portion where the ion beam 3 incidents in the specimen 7 and a thin induced conductive layer is formed at that wide area.

Contacting the ground probe 30 driven by the probe drive unit 31 to the portion of the induced conductive layer where the contact is not influences the processing or observation by the ion beam, the electric charge accumulated at the processing or observation area of the induced conductive layer is released to the ground.

When irradiating the positive ion beam 22 to the area where the ground probe 30 contacts the surface of the specimen, the electrical contact between the induced conductive layer and the ground probe 30 is ensured and the electric charge, accumulated by the irradiation of the ion beam, flows to the ground through the ground probe 30.

Probe drive unit 31 is controlled by the host computer 100 through the probe controller 93. And the contact state of the ground probe 30 and the specimen 7 is monitored by the contact state detecting mechanism such as strain gage. With this contact state detecting mechanism, the contact of the ground probe 30 to the specimen 7 will not cause the damage of the surface of the specimen 7 to influence the function of the specimen 7.

In case the specimen 7 is a LSI, there are many electrode pads (which is not illustrated in the figures) exposed in the surface of the specimen and electrically connected to the ground through diodes. And the induced conductive layer at the surface of the specimen is electrically connected to the electrode pads by irradiating the positive ion beam 22 to the area including the electrode pads. And the electric charge, which is accumulated at the area where observation or processing is performed by irradiating the ion beam 3, is discharged to the grand from the induced conductive layer through electrical pad and the diodes. And in this case, the ground probe is not necessarily needed.

In case the retainer plate 32 made of metal for fixing the specimen 7 contacts the surface of the specimen sufficiently and irradiating the positive ion beam 22 on the surface of the specimen including the area where the retainer plate 32 is in contact with the surface of the specimen, the induced conductive layer is electrically connected to the retainer plate 32. The electric charge, which is accumulated at the area which is observed or processed by the irradiation of the ion beam 3, is discharged to the grand from the induced conductive layer through conductive retainer plate 32.

Therefor, charge build-ip at the surface of the specimen is avoided.

As described above, discharge means for release the accumulated electric charge at the surface of the specimen to the ground is used depending on the situation. Using a ground probe 30 consist of conductive material as a discharge means and changing its contact point with the specimen with a shift of the ion beam 3 irradiating position on the surface of the specimen makes it possible to treat a specimen regardless its shape or type. When changing its contact point with the specimen, damaging the surface of the specimen can be avoided by the following way. That is, detecting the state of the contact between the ground probe 30 and the specimen 7 with a contact state detecting mechanism such as a strain gage. And a signal according to the detected state of the contact between the specimen and the ground probe 30 is fed back to the probe controller 93. The probe drive unit 31 is controlled by the fed back signal of the detected state of the contact.

Sputtering by the irradiated positive ion beam 22 sometimes causes a problem to the specimen. To avoid this problem, it is desirable to accelerate the positive ion beam with a relatively low acceleration voltage. Consequently, small mass number specie is desirable for the positive ion beam 22. But the acceleration voltage of ion beam as well as mass number of it is influences the ionization of the specimen surface. So, an appropriate acceleration voltage of the ion beam and its mass number is determined experimentarily. And a proper ion specie and its acceleration voltage are applied.

As explained above, in the first embodiment, a positive ion beam 22 of an appropriate ion specie and accelerated with an appropriate voltage is irradiated on the surface of the specimen where the ion beam 3 is irradiated for processing and discharge means (such as geand probe 30, an electrode pad or a retainer plate 32) is in contact with the surface of the specimen. And the electric charge accumulated on the surface of the insulating layer flows to the grand through the discharge means. Electric charge build-up is avoided by the flow of the accumulated electric charge and the misalignment of the ion beam 3, caused by a deviation of the ion beam 3, to the surface of the insulating layer is prevented. And electrostatic discharge, caused by an excessive accumulation of electric charge on the surface of the insulating layer, is also avoided.

In addition, positive voltage applied to the extracting electrode 8 to efficiantry extract the secondary electron to the charged particle detector 9 will not influence to the detection of the secondary electron. As a result,a clear secondary electron image with a high SfN ratio is obtained in real time. And it makes possible to inspect the pattern formed on the specimen at real time and also to position the ion beam 3 on a pattern pricisely for processing.

The focused ion beam apparatus as explained above is available for correcting a LSI with multilayer structure or for partially etching and exposing inside the LSI to observe the exposed cross sectional view. These operations are able to be carried out by one apparatus. In this case, it is also necessary to detect a secondary ion in addition to the secondary electron. The quantity ot the secondary ion emmited form the specimen by the irradiation of the ion beam differs by the materials of the specimen. This makes it possible to observe the specimen by the difference of the material. On the other hand, the quantity of a secondary electron emmited from the surface is not different by the material of the specimen. This indicates that when irradiating an ion beam to a specimen and observing it by the difference of the material, a secondary ion detection provides clear and high resolution image comparing to that of secondary electron.

To detect a secondary ion in a focused ion beam processing apparatus, the following step is very effective.

At the outset, irradiating a positive ion beam 22 to a specimen 7 to avoid a charge up at the surface of the specimen 7. Then stop the irradiation of the positive ion beam 22. After that, irradiating an ion beam 3 to the specimen 7 and detecting a secondary ion emanated from the specimen by the irradiation.

Processing above step, it is possible to detect a secondary ion effectively by a detector. Which means, it is possible to detect a secondary ion by extracting it to the charged particle detector 9 while applying a negative voltage to the electrode 8 during the irradiating an ion beam 3 to the specimen 7. During the detection, stop the irradiation of the positive ion beam 22 not to influence the detection. And a secondary ion image, which images the materials and the shape of the surface of the specimen based on the differecne of the secondary ion emmition rate by material and shape. As a result, it makes possible to correct a LSI with multilayer structure or partially etch and expose inside the LSI to observe the exposed cross sectional view by the same focused ion beam processing apparatus.

Figure 2:
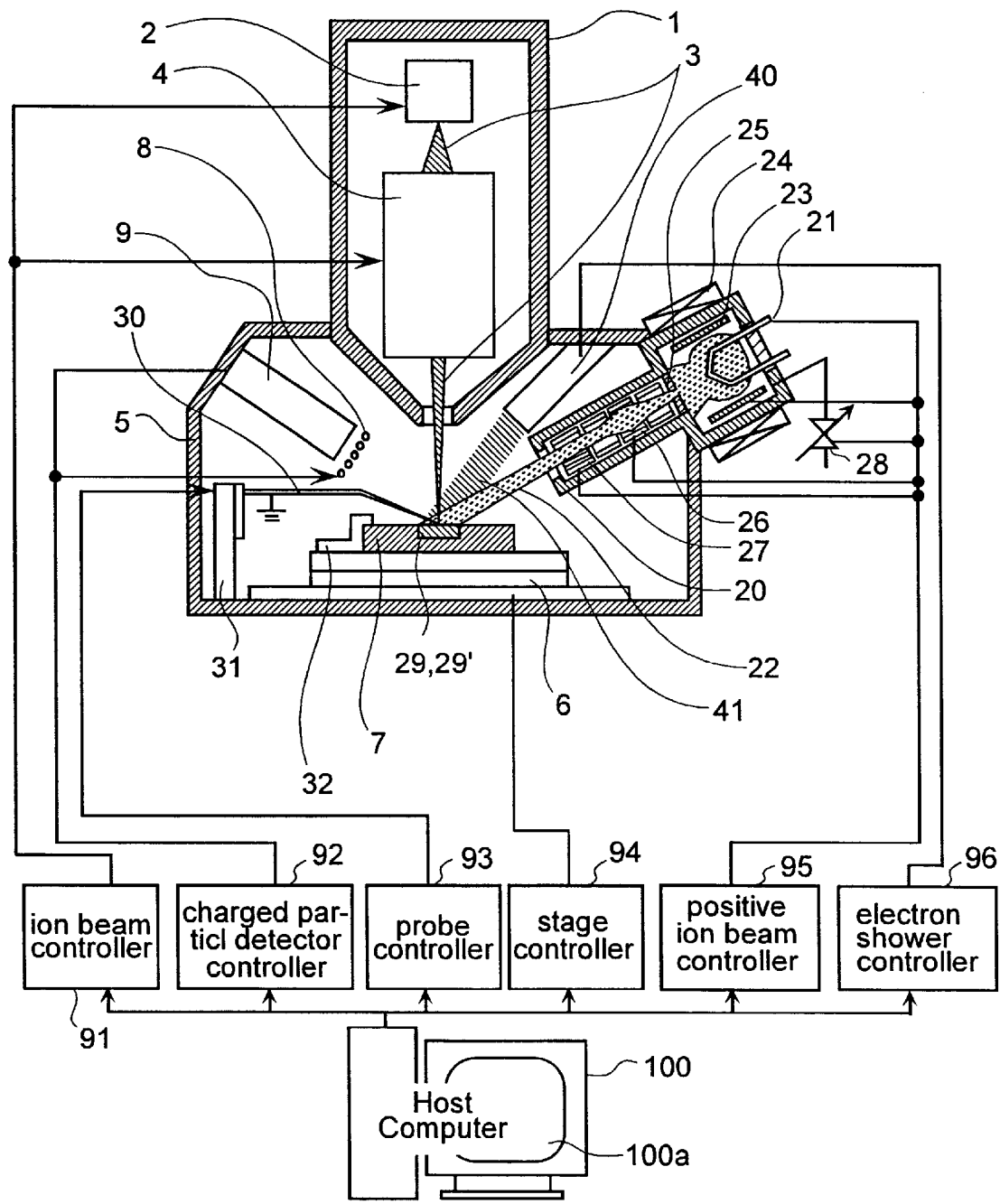
FIG. 2 illustrates a rough front image of the focused ion beam processing system according to the second embodiment of this invention.

FIG. 2 illusurates a rough image of a focused ion beam processing apparatus according the the second embodiment of this invention.

In the second embodiment, a focused ion beam processing appratus detects both a secondary electron and a secondary ion emenated from a specimen 7 which is irradiated by a ion beam 3.

By the irradiation of the ion beam 3, a secondary electron, which quantity is sufficient to get a clear and high S/N ratio image of the surface of the specimen, is emanated from the specimen. This makes possible to observe a pattern formed on the surface of the specimen 7 clearly and to position the ion beam 3 on the pattern precisely when processing it by the ion beam 3. Consequently, precise etching of a specimen, which is covered with an insulating material, by an ion beam and thin film forming on an insulating film which covers a specimen are realized.

The quantity of a secondary ion emanated from a specimen by the ion beam irradiation differs by the material on the surface of the specimen, and in a focused ion beam processing apparatus, detection of a secondary ion enables the observation of the material of the specimen.

So, detecting both a secondary electron and a secondary ion in the same focused ion beam processing apparatus, makes it possible to correct a LSI with multilayer structure or partially etch and expose inside the LSI to observe the exposed cross sectional view.

In the second embodiment, the focused ion beam processing apparatus is the one which is attached a electron gun 40 to the focused ion beam processing apparatus.

When detecting a secondary electron with the charged particle detector 9 by applying a positive voltage to the extracting electrode 8, irradiate the positive ion beam 22 to the specimen like the first embodiment and illustrated in the FIG. 1. And in this case the electron gan 40 is not used.

And when detecting a secondary ion with the charged particle detector 9, stop the irradiation of the positive ion beam to the specimen at first. There are some ways to stop the irradiation of the positive ion beam 22. One of them is extinguishing the plasma in the positive ion beam supply means 20 and stop the supply of the positive ion beam 22. Another way to stop the supply of the positive ion beam 22 is to control the voltage applying to the extracting electrode 25 and confining the ion in the plasma. Still another way is to providing a shield plate (not illustrated in the figures) at the tip of the positive ion beam supply means 20 and shield the tip of the positive ion beam supply means 20 with the shield plate.

After stopping the irradiation of the positive ion beam 22, applying a negative voltage to the extracting electrode 25 to extract a secondary ion to the charged particle detector 9. Then irradiating a electron beam 41 produced by the electron gun 40 to the area on the surface of the specimen containing the contact point of grand probe 30 and the specimen 7 and also including the area irradiated by the ion beam 3. The electron gun 40 is consist of a filament which emits a thermal electron, an anode to extract the electron emitted from the filamen, a electrostatic lens and a deflector.

When irradiating a electron beam 41, which is accelerated to a certain value, to a surface of an insulating material, a very thin conductive layer 29' is formed at the surface of the insulating material. This very thin conductive layer electrically connects to the ground probe 30. And an electric charge caused by the irradiated ion beam 3 flows to the earth through the very thin conductive layer 29' and ground probe 30. As explained above, it makes possible to detect a secondary electron and a secondary ion while irradiating the ion beam 3 by switching the irradiation of electron beam 41 and the positive ion beam 22.

When an operator input a command, which is selecting one of the secondary electron or the secondary ion, to the host computer 100 which controls the focused ion beam processing apparatus, one of electron shower controller 96 or positive ion beam controller 95 is selected. Then by the selected controller, either the electron gun 40 or the positive ion beam supply means 20 is driven. In case of switching the electron shower controller 96 and the positive ion beam controller 95 by inputting a command to the host computer 100, it is occasionally necessary to consider a time for the electron beam 41 or the positive ion beam 22 to irradiate the specimen by position and quantity stably.

Both of the electron gun 40 and the positive ion beam supply means 20 have a filament. The quantity of the thermal electron emitted from the filament is influenced by a temperature of it. And to shorten the time for stabilizing, both of the filament of the electron gun 40 and the positive ion beam supply means 20 are supplied power while one of them is not in use.

Figure 3:
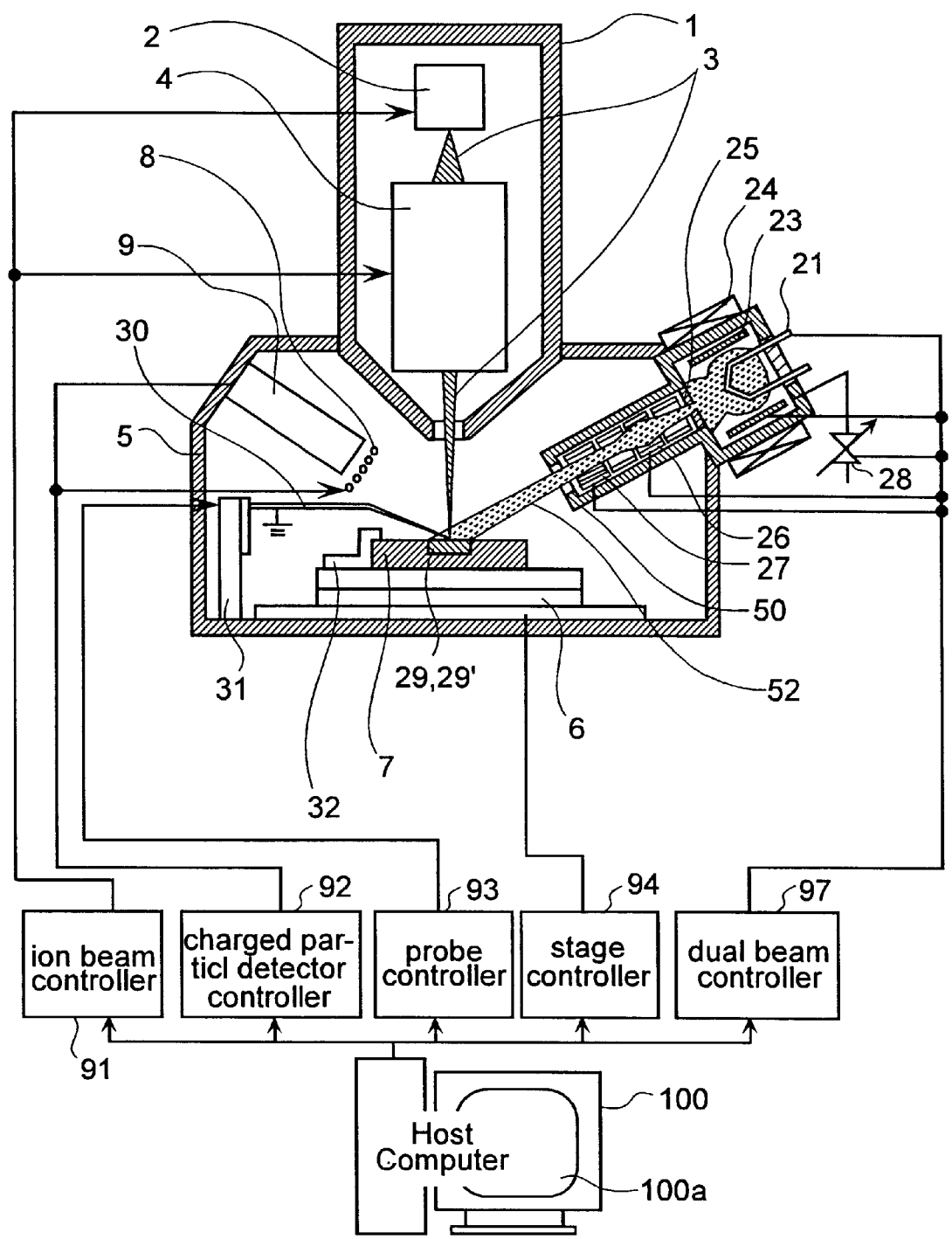
FIG. 3 illustrates a rough front image of the focused ion beam processing system according to the third embodiment of this invention.

FIG. 3 shows a rough image of the focused ion beam apparatus relating to the third embodiment of this invention.

In the third embodiment, a focused ion beam processing appratus detects both a secondary electron and a secondary ion emenated from a specimen 7 which is irradiated by a ion beam 3.

By the irradiation of the ion beam 3, a secondary electron, which quantity is sufficient to get a clear and high S/N ratio image of the surface of the specimen, is emanated from the specimen. This makes possible to observe a pattern formed on the surface of the specimen 7 clearly and to position the ion beam 3 on the pattern precisely when processing it by the ion beam 3. Consequently, precise etching of a specimen, which is covered with an insulating material, by a ion beam and thin file forming on a insulating film which covers a specimen are realized.

The quantity of a secondary ion emanated from a specimen by the ion beam irradiation differs by the material on the surface of the specimen, and in a focused ion beam processing apparatus, detection of a secondary ion enables the observation of the material of the specimen.

So, detecting both a secondary electron and a secondary ion in the same focused ion beam processing apparatus, makes it possible to correct a LSI with multilayer structure or partially etch and expose inside the LSI to observe the exposed cross sectional view.

The basic structure of the focused ion beam processing apparatus relating to the third embodiment is the same to that of the first embodiment shown in FIG. 1. The difference from the first embodiment is that the focused ion beam processing apparatus in the third embodiment employs a dual beam supplying means 50 which emits either positive ion beam or electron.

Gas is introduced to the dual beam supplying means 50 through a valuable flux valve or mass flow rate control means 28 from a bomb (not illustrated in the figures). A thermal electron emitted from a filament provided to the dual beam supplying means 50 is extracted by the anode 23 and restricted by the magnetron type electromagnetic field formed by the solenoid 24 (which can be substituted by a permanent magnet). The gas introduced into the dual beam supplying means 50 turn into plasma by the thermal electron restricted in the magnetron type electromagnetic field.

To detect a secondary electron emanated from the specimen by the irradiation of the ion beam 3, applying a negative voltage, comparing to the plasma potential, to the extracting electrode 25 like the first embodyment and obtain a positive ion beam 52(22). The positive ion beam 52(22) is converged by the lens 26 and irradiate the area surrounding the position where the ion beam 3 irradiates on the surface of the specimen. And the irradiation of the positive ion beam 52(22) produces a very thin conductive layer 29 on the surface of the specimen. With this conductive layer 29, accumulated electric charge caused by the irradiation of the ion beam 3, in processing or observing, flows to the earth through a discharge means provided between the specimen and the ground.

To detect a secondary ion emanated from the surface of the specimen by the irradiation of the ion beam 3, applying a positive voltage, comparing to the plasma pote tial, to the extracting electrode 25 to extract an electron from the plasma. By controling the voltage suplying to the lens 26 and deflector 27, the extracted electron becoms an electron beam 52(41). This electron beam 52(41) is converged by the lens 26 and controled ite path by the deflector 27 to irradiate the area surounding the position where the ion beam 3 irradiates on the surface of the specimen. And the irradiation of the electron beam 52(41) produces a very thin conductive layer 29 on the surface of the specimen. With this conductive layer 29, accumulated electric charge caused by the irradiation of the ion beam 3, in processing or observing, flows to the earth through a discharge means provided between the specimen and the ground.

When using a dual beam suplying means 50, a voltage suplying to the extracting electrode 25, lens 26 and deflector 27 is perdetermined by experimentarily or by simulation and memorized in a control system. Or, it is also possible to prestore an automatic sequnece program for calculating the optimum condition of the dual beam suply means 50 in the control system. Said program automatically calculating the optimum condition from an electric current of dual beam 52 (and, if necessary, a distribution of the beam current) which is measured when changing the detecting condition from secondary ion to secondary electron and vice versa by verying the voltage applying to each of the electrode of the dual beam supply means 50. The electron beam in the dual beam supply system 50 can be replaced by a negative ion beam. In this case, it is need to produce a plasma which contains bith of the positive ions and the negative ions. One way to produce such a plasma is equipping a gas supplying means to the apparatus for supplying several kinds of gas. By providing this dual beam supplying means 50, the structure of the equipment can be simplified and the cost of the equipment is reduced.

Figure 4:
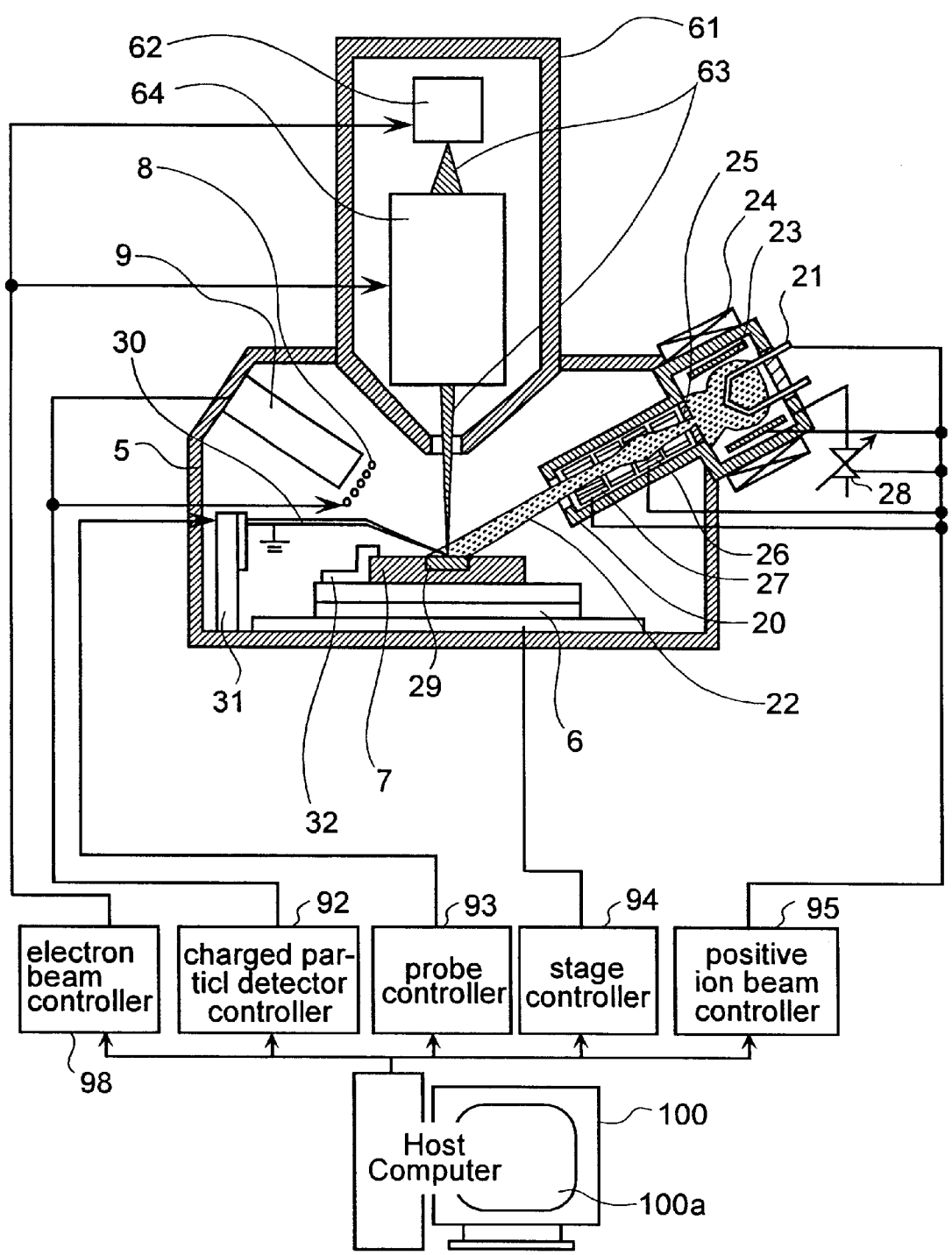
FIG.4 illustrates a rough front image of the focused ion beam system, such as electron microscope or electron beam image detection system or electron beam testing system or electron beam patterning system or electron beam assisted etching system or electron beam CVD system, according to the fourth embodiment of this invention.

The FIG. 4 illustrates an electron beam equipment (such as an electro microscope, an electro beam image detection system, an electo beam patterning system, an electro beam assisted etching system and an electro beam chemical vaper deposition system) relating to this invention.

The electron beam apparatus according to this present invention, differs from a focused ion beam apparatus in the internal structure of the electron beam body tube 61. Electronic source 62 is a thermionic emission type (tungsten hair pin filament or lanthanum hexaboride point cathode)or a field emission type. The accelerating voltage applying to the electron beam 63 is, in general, between 1 KV and several 100s KV. And, the electric current of an electron beam is set between several pA and several 10s nA. Electron beam 63 is converged to a diameter of 1 nm. The diameter of the beam can be changed according to the way of use. One of the example of the electron optics system 64 is composed of a drawing electrode, an accelerating electrode, a Stigma deflection coil, an electro static lens and a magnetic lens. An in-lens type objective lens is also applied to the electro optical system 64.

In electro beam apparatus, the secondary particle which amanates from the specimen by the irradiation of the electron beam is mostly a secondary electron. In this case, secondary particle to be detected is inevitably a secondary electron. When irradiating an electron beam to a specimen which surface is dielectric, the quantity of a secondary electron emanated form the specimen verys form the accelerating voltage applyed to the electron beam.

Based on this phenomena, it is commonly employed to the electron beam apparatus in observing a secondary electron image of the specimen by setting an accelerating voltage applyed to the elctron beam (usually around 1 KV) to balance the quantity of the insident electron and the emanated secondary electron. But the resolution of the electron image goes down by reducing the accelarating voltage applying to the electron beam.

Therefore, the charge up prevention mechanism like this preferred embodiment is valid. To prevent charge up of sample 7, which surface is covered with a dielectric material by the Iirradiation of the electron beam 63, irradiate the positive ion beam 22 from the positive ion beam supply means 20 provided in the sample room 5. The positive ion beam 22, which is produced from an appropriate gas and is accelerated at a proper voltage, irradiates an area on the surface of the dielectric material in which the electron beam 63 is irradiated and also an area in which a discharge means (such as ground probe 30, electrode pad and retainer plate 32) conducts the dielectric material. As a result, the electric charge accumulated on the surface of the insulating material by the irradiation of the electron beam 63 is discharged to the ground through a discharge means, and charge up at the surface of the insulating material can be avoided. In addition, it does not become an obstacle against detecting a secondary electron even if a positive voltage is applied to the extracting electrode 8 to efficiently extract the secondary electron to the charged particle detector 9. And a clear secondary electron image is obtained at real time. This real time observation makes it possible to observe a pattern formed on the surface of the specimen instantly and, in case of processing a specimen, a precise positioning of the ion beam 3 to a pattern formed on a surface of the a specimen.

In the embodiment explained above, gases at least one of helium, neon, argon, nitrogen, hydrogen or inert gas such as xenon can be used to generate positive ion. And, oxygen can be used as a raw material gas to generate a negative ion in the third embodiment.

And, it is possible in the above explained embodiments to apply them to the charged particle beam gas-assisted etching (ion beam assisted etching or electron beam reed strike etching) using reactive gas for enhancement. In this case, a means for supplying reactive gas (for example, chlorine, xenon difluoride, iodine, bromine, etc.) in the vicinity of the sample through a nozzle is provided to the apparatus explained above embodiments.

When processing a specimen with supplying a reactive gas in the vicinity of the sample through a nozzle, the process speed is much higher than that of without supplying a reactive gas.

And in the above explained embodiments, it is possible to apply each of them to an electron beam CVD. That is, as is mentioned above, by irradiating a sample with a charged particle beam in the state that a gas for deposition (for example, hexacarbonyl of tungsten or TEOS) is supplied in the vicinity of the sample through a nozzle, a thin film is formed at a desired portion on the sample.

According to this invention, when irradiating a forcused charged particle beam at an insurating film on a specimen, charge up at the surface of the insurating film can be avoided. And it is possible to get a high resolution and clear secondary electron image of the surface of the specimen.

And it makes possible to observe a pattern formed on a sample covered with a insurating layer with a clear and high resolution secondary particle image. Also it makes possible to positioning the focused charged particle beam on the patter formed on the insurating layer with high accuracy.

And, it is also possible to realize a precise process for processing a specimen with a charged particle beam such as etching or deposition.

According to this invention, charge up of a surface of a specimen such as a LSI chip, wafer or a photomask (which surface is covered with a insurating film or a pattern transperant to a exposure light) can be avoided when irradiating a charged particle beam on it. And it makes possible to obtain a secondary electron image of a specimen with high contrast and clear edge image of a pattern formed on the specimen. This enables the observation of the pattern with a high resolution secondary charged particle image and also makes it possible to reparing defects in the order of submicron or subsubmicron grown on a specimen such as a LSI or a photomask. Thus repairing the defects will decrease a behind time which is caused by reproducing the LSI and its mask to correct defects and also reduce the cost for manufacturing LSI and its masks.

What is claimed is:

1. A secondary charged particle image acquisition method for detecting a secondary charged particle image, comprising;
   irradiating a surface of a specimen with a focused charged particle beam and detecting a secondary charged particle emanated from the surface of the specimen;
   obtaining a secondary charged particle image based on the detected secondary charged particle;
   irradiating a positive ion beam on the surface of said specimen where said focused charged particle beam is irradiated; and
   inducing a conductive layer on the surface of said specimen by the irradiation of said positive ion beam and diffusing an electric charge on the surface of said conductive layer.

2. Secondary charged particle image acquisition method according to the claim 1, wherein said induced conductive leyer is so induced that an electric charge diffusion means is electrically connected to said induced conductive layer.

3. Secondary charged particle image acquisition method according to the claim 1, wherein said focused charged particle beam irradiated to a specimen is a focused ion beam.

4. Secondary charged particle image acquisition method according to the claim 1, wherein said focused charged particle beam irradiated to a specimen is a focused electron beam.

5. Secondary charged particle image acquisition method according to the claim 1, wherein said secondary charged particle is a secondary electron and said detected secondary charged particle image is a secondary electron image.

6. Secondary charged particle image acquisition method according to the claim 1, wherein said secondary charged particle is a secondary ion and said detected secondary charged particle image is a secondary ion image.

7. Secondary charged particle image acquisition method according to the claim 1, further comprising the steps of
   stopping the irradiation of said positive ion beam;
   irradiating the surface of said sample with said focused charged particle beam wherein an electric charge of said surface is discharged through said induced conductive layer;
   detecting a secondary particle which is emanated from the surface of said specimen irradiated by said charged particle beam and obtaining a secondary charged particle image of said sample; and
   controlling a location of the focused charged particle beam on the surface of said specimen based on said acquired secondary charged particle image and processing the specimen with said irradiated charged particle beam.

8. Secondary charged particle image acquisition method according to the claim 1, wherein said secondary charged particle is a secondary electron and a secondary ion which is detected alternatively and a secondary charged particle image is acquired by the detection.

9. A focused charged particle beam apparatus; comprising,
   a charged particle beam irradiation means which irradiates a charged particle beam to a surface of a sample which is at least partially covered with an insulation film;
   image acquisition means which detects a secondary charged particle emanated from the surface of the specimen irradiated by said charged particle beam launched from said charged particle beam irradiation means and acquires a secondary charged particle image of said surface; and
   positive ion beam irradiation means which irradiates a positive ion beam to the surface of said sample including an area to which said focused charged particle beam is irradiated; and
   a diffusion means which diffuses an electric charge to the earth, said electric charge is caused by said irradiation of said charged particle beam and said electric charge flows through an induced conductive layer formed on the surface of said specimen by said irradiation of said positive ion beam.

10. A focused charged particle beam apparatus according to the claim 9, wherein said diffusion means electrically connects the earth and said induced conductive layer formed on the surface of said specimen.

11. A focused charged particle beam apparatus according to the claim 9, wherein said focused charged particle beam irradiating means irradiates a focused ion beam on the surface of a specimen.

12. A focused charged particle beam apparatus according to the claim 9, wherein said focused charged particle beam irradiating means irradiates an electron beam on the surface of the specimen.

13. A focused charged particle beam apparatus according to the claim 9, wherein said focused charged particle beam irradiating means irradiates an ion beam on the surface of the specimen.

14. A focused charged particle beam apparatus according to the claim 9, wherein said image acquisition means detects a secondary electron emanated from the surface of the specimen irradiated by said charged particle beam launched from said charged particle beam irradiation means and acquires a secondary electron image of said surface.

15. A focused charged particle beam apparatus according to the claim 9, wherein said image acquisition means detects a secondary ion emanated from the surface of the specimen irradiated by said charged particle beam launched from said charged particle beam irradiation means and acquires a secondary ion image of said surface.

16. A focused charged particle beam apparatus according to the claim 9, wherein said image acquisition means includes a secondary electron detector and a secondary ion detector and a changeover switch which selects one of the output from said secondary electron detector and said secondary ion detector and acquires a secondary electron image or secondary ion image of said surface.

17. A focused charged particle beam apparatus, comprising;
   a focused charged particle beam irradiation means which irradiates a surface of a specimen with a focused charged particle beam;
   image acquisition means which detects a secondary charged particle emanated from the surface of said specimen by the irradiation of said focused charged particle beam launched from said charged particle beam irradiation means and acquires a secondary charged particle image of the surface of said specimen; and
   a charged particle beam irradiation means which irradiates a charged particle beam to the specimen to produce an induced conductive layer in an insulating portion on the surface of the specimen where said focused charged particle beam is irradiated.

18. A focused charged particle beam apparatus according to the claim 17, said charged particle beam irradiation means irradiates the surface of said sample with one of an ion beam or an electron beam.

19. A focused charged particle beam apparatus according to the claim 17, wherein said image acquisition means detects a secondary electron or a secondary ion emanated from the surface of said specimen by the irradiation of said focused charged particle beam launched from said charged particle beam irradiation means and acquires a secondary electron image or a secondary ion image of the surface of said specimen.

* * * * *